(12) United States Patent
Chen et al.

(10) Patent No.: US 12,707,671 B2
(45) Date of Patent: Aug. 11, 2026

(54) VERTICAL MOSFET DEVICE

(71) Applicants: Beijing Superstring Academy of Memory Technology, Beijing (CN); INSTITUTE OF MICROELECTRONICS, CHINESE ACADEMY OF SCIENCES, Beijing (CN)

(72) Inventors: Zhuo Chen, Beijing (CN); Huilong Zhu, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 1148 days.

(21) Appl. No.: 17/770,871

(22) PCT Filed: Dec. 13, 2021

(86) PCT No.: PCT/CN2021/137385
§ 371 (c)(1),
(2) Date: Jun. 15, 2023

(87) PCT Pub. No.: WO2023/102951
PCT Pub. Date: Jun. 15, 2023

(65) Prior Publication Data

US 2024/0145591 A1 May 2, 2024

(30) Foreign Application Priority Data

Dec. 6, 2021 (CN) ........................ 202111479807.4

(51) Int. Cl.
*H10D 30/63* (2025.01)
*H10D 30/01* (2025.01)
(Continued)

(52) U.S. Cl.
CPC ........... *H10D 30/63* (2025.01); *H10D 30/025* (2025.01); *H10D 62/292* (2025.01);
(Continued)

(58) Field of Classification Search
CPC .... H10D 30/63; H10D 30/025; H10D 62/292; H10D 64/017; H10D 64/018;
(Continued)

(56) References Cited

U.S. PATENT DOCUMENTS 9,647,112 B1 * 5/2017 Balakrishnan ....... H10D 62/151
10,236,346 B1 * 3/2019 Bi ........................ H10D 62/371
(Continued)

FOREIGN PATENT DOCUMENTS

CN 103854982 A 6/2014
CN 103632977 B 2/2016
(Continued)

OTHER PUBLICATIONS

International Search Report dated Aug. 25, 2022 received in International Application No. PCT/CN2021/137385.
(Continued)

*Primary Examiner* — Mohammad M Hoque
(74) *Attorney, Agent, or Firm* — Scully, Scott, Murphy & Presser, P.C.

(57) ABSTRACT

The present disclosure relates to a vertical MOSFET device, a manufacturing method and application thereof. The method includes: forming a first silicon layer, a first germanium-silicon layer, a second germanium-silicon layer, a third germanium-silicon layer and a second silicon layer that are vertically stacked from bottom to top on a substrate, where
(Continued)

molar contents of germanium in the first germanium-silicon layer and the third germanium-silicon layer are both greater than the content of germanium in the second germanium-silicon layer; etching to form a nano stack structure; selectively etching the first germanium-silicon layer and the third germanium-silicon layer to form a first groove and a third groove; forming inner spacers of an extension region in the first groove and the third groove; selectively etching the second germanium-silicon layer to form a gate groove; forming a dummy gate in the gate groove; forming sources/drains; forming an active region with a shallow trench isolation layer; and removing the dummy gate to form a gate dielectric layer and a gate. The present disclosure can well control the size of channel, the size of inner spacers of the extension region, the size of the gates, and the like, and is applicable to either nanosheet or nanowire structures.

6 Claims, 13 Drawing Sheets

(51) Int. Cl.
*H10D 62/17* (2025.01)
*H10D 64/01* (2025.01)
*H10D 64/23* (2025.01)

(52) U.S. Cl.
CPC ......... *H10D 64/017* (2025.01); *H10D 64/018* (2025.01); *H10D 64/252* (2025.01); *H10D 64/258* (2025.01)

(58) Field of Classification Search
CPC ............... H10D 64/252; H10D 64/258; H10D 30/6728; H10D 30/6735; H10D 62/121; H10D 62/118; H10D 30/024; H10D 30/62; H10D 64/513
USPC .......................................................... 257/329
See application file for complete search history.

(56) References Cited

U.S. PATENT DOCUMENTS

2013/0095623 A1 4/2013 Guo et al.
2018/0197793 A1* 7/2018 Guo ..................... H10D 84/038
2019/0081155 A1 3/2019 Xie et al.
2019/0103317 A1 4/2019 Yu et al.
2019/0189769 A1 6/2019 Basker et al.
2019/0221483 A1 7/2019 Mulfinger et al.
2020/0251558 A1* 8/2020 Hashemi ................ H10D 30/63
2020/0388698 A1* 12/2020 Veloso ................. H10D 64/252
2020/0395467 A1* 12/2020 Yu .......................... H10D 30/63
2021/0066490 A1 3/2021 Yang et al.
2021/0134958 A1 5/2021 Cho et al.

FOREIGN PATENT DOCUMENTS

CN 105990119 A 10/2016
CN 106298934 A 1/2017
CN 106711227 A 5/2017

OTHER PUBLICATIONS

First Office Action dated Mar. 11, 2025 received in Chinese Patent Application No. 202111479807.4.

* cited by examiner

VERTICAL MOSFET DEVICE

TECHNICAL FIELD

The present disclosure relates to the technical field of transistors, and in particular to a vertical MOSFET device, a manufacturing method and application thereof.

BACKGROUND

For a MOSFET, since an integration level thereof is an important factor in determining the price of product, an increase in the integration level would be particularly desired. For two-dimensional or planar semiconductor devices, since their integration level is mainly determined by the projected area of a unit memory cell on a surface of silicon chip, the integration level is greatly affected by the level of fine patterning technology. However, extremely expensive process equipment for increasing pattern fineness will place practical limitations on the increase of the integration level of two-dimensional or planar semiconductor devices. In order to overcome such limitations, three-dimensional semiconductor memory devices including three-dimensionally arranged memory cells have been proposed. 3D integration is a breakthrough in scaling of memory devices such as logic devices and DRAM. However, due to the fluctuation of processes such as photolithography and reactive ion etching during etching and the complexity of process integration, vertical nanosheet or nanowire MOSFETs have problems such as difficulty in controlling sizes such as a thickness of the inner spacer.

At present, the performance of vertical transistor devices still lags far behind that of mature planar transistors and FinFETs. This is because there are many challenges for vertical transistors in key process modules and process integration. The key process modules for vertical transistors include etching and selective etching to form nanowire and nanosheet channels and inner spacers. For this purpose, the present disclosure is proposed.

SUMMARY

A main object of the present disclosure is to provide a manufacturing method of a vertical MOSFET device, which can well control the size of channel, the size of inner spacers of an extension region, the size of the gates, and the like, and is applicable to nanosheet or nanowire structures.

Another object of the present disclosure is to provide a vertical MOSFET device, which increases size-controllable inner spacers of the extension region, and has better electrical performance compared with existing vertical transistor devices, such as low leakage current, small parasitic capacitance, etc.

In order to achieve the above objects, the following technical solutions are provided according to the present disclosure.

A first aspect of the present disclosure provides a manufacturing method for a vertical MOSFET device, which includes:

providing a substrate;

forming a first silicon layer, a first germanium-silicon layer, a second germanium-silicon layer, a third germanium-silicon layer and a second silicon layer that are vertically stacked from bottom to top on the substrate; in which a molar content of germanium in the first germanium-silicon layer and a molar content of germanium in the third germanium-silicon layer are both greater than a content of germanium in the second germanium-silicon layer;

etching the first silicon layer, the first germanium-silicon layer, the second germanium-silicon layer, the third germanium-silicon layer and the second silicon layer to form a nano stack structure;

selectively etching the first germanium-silicon layer and the third germanium-silicon layer in the nano stack structure, so as to form a first groove at a sidewall of the first germanium-silicon layer and a third groove at a sidewall of the third germanium-silicon layer;

forming an inner spacer of an extension region in the first groove and an inner spacer of an extension region in the third groove;

selectively etching the second germanium-silicon layer to form a gate groove at a sidewall of the second germanium-silicon layer;

forming a dummy gate in the gate groove;

doping the first silicon layer and the second silicon layer respectively to form sources/drains;

after the source/drain is formed, etching the substrate and depositing dielectric material to form an active region with a shallow trench isolation layer;

removing the dummy gate in the active region, and forming a gate dielectric layer and a gate in the gate groove in sequence; and performing subsequent processes.

A second aspect of the present disclosure provides a vertical MOSFET device, which includes a substrate, as well as a source/drain, a first extension region, a channel, a second extension region, and a source/drain stacked from bottom to top on the substrate; gates are located on both sides of the channel, and the gates and the channel are isolated by gate dielectric; first inner spacers are located on both sides of the first extension region, second inner spacers are located on both sides of the second extension region, and the gates are located between the first inner spacers and the second inner spacers; and where the first extension region, the channel and the second extension region are all made of germanium-silicon material, and a molar content of germanium in the first extension region and a molar content of germanium in the second extension region are both greater than a content of germanium in the channel; and the sources/drains are doped silicon.

A third aspect of the present disclosure provides application of the above vertical MOSFET device or a vertical MOSFET device prepared by the above manufacturing method in an electronic device.

As compared with the prior art, the present disclosure achieves the following technical effects: by adding inner spacers between the gate and the source/drain, and by designing a specific process sequence (for example, designing a germanium-silicon epitaxial stack with different germanium compositions and different etching selectivities, a replacement mask and an inner spacer protective layer structure, which realizes an integrated development of the inner spacer process of the vertical transistor), a controllable size of the inner spacers is realized, and controllable sizes of the gate and the channel are also realized synchronously, thereby reducing the leakage current problem of the device, reducing the parasitic capacitance, and reducing the undesirable phenomenon in the processing of the device; and the vertical MOSFET device produced by the method of the present disclosure can be used in various memory devices such as SRAM, DRAM and Flash.

BRIEF DESCRIPTION OF THE DRAWINGS

Various other advantages and benefits will become apparent to those skilled in the art upon reading the following detailed description of preferred embodiments. The drawings are provided for the purpose of illustrating the preferred embodiments only, and should not be considered as limiting the present disclosure.

DETAILED DESCRIPTION

Hereinafter, embodiments of the present disclosure will be described with reference to the accompanying drawings. However, it should be understood that these descriptions are exemplary only, and are not intended to limit the scope of the present disclosure. In addition, in the following description, descriptions of well-known structures and techniques are omitted to avoid unnecessarily obscuring the concepts of the present disclosure.

Various schematic structural views according to the embodiments of the present disclosure are shown in the accompanying drawings. The figures are not drawn to scale, in which some details have been exaggerated for clarity, and some details may have been omitted. The shapes of the various regions and layers shown in the figures, as well as their relative sizes and positional relationships are only exemplary; in practice, there may be deviations due to manufacturing tolerances or technical limitations, and those skilled in the art can additionally design regions/layers with different shapes, sizes and relative positions as required.

In the context of the present disclosure, when a layer/element is referred to as being located "on" another layer/element, it can be directly located on said another layer/element, or intervening layers/elements may be present therebetween. In addition, if a layer/element is located "on" another layer/element in one orientation, then when the orientation is reversed, the layer/element may be located "below" said another layer/element.

As described in the "BACKGROUND", in the prior art, due to the uncontrollable structural sizes of vertically stacked nanowire/nanosheet transistors such as the sizes of inner spacers and gate in the extension region, there are differences in the various structural sizes in the transistors, thereby limiting the practical application of the vertically stacked nanowire/nanosheet transistors. In view of the above problems and after research, a manufacturing method for a vertical MOSFET device is provided according to the present disclosure. In the method, inner spacers are added between the gate and the source/drain, and by designing a specific process sequence, a controllable size of the inner spacers is realized, and controllable sizes of the gate and the channel are also realized synchronously, thereby reducing the leakage current problem of the device, reducing the parasitic capacitance, and reducing the undesirable phenomenon in the processing of the device. The preparation method provided by the present disclosure includes the following steps S1 to S11.

Figure 1:
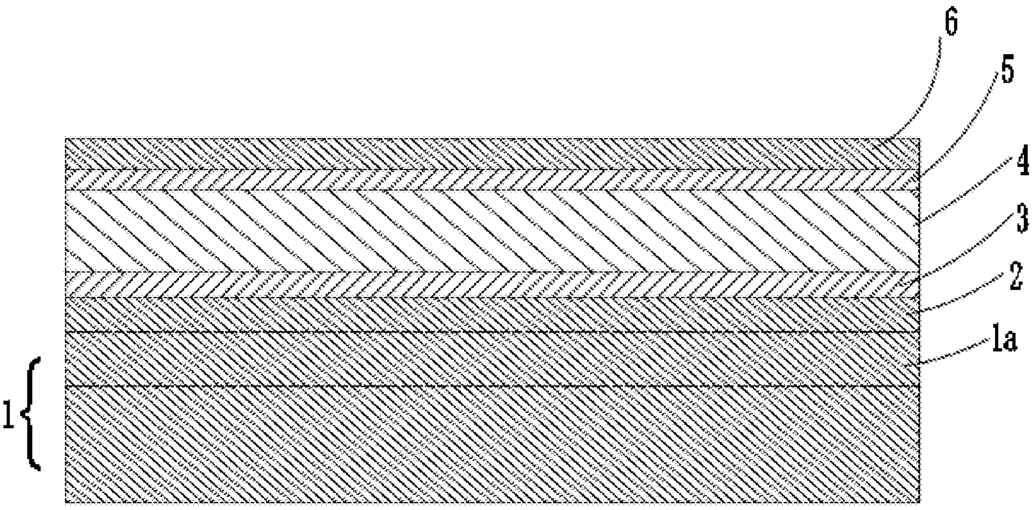
FIGS. 1 to 25 are structural views obtained in various steps of the manufacturing method of the vertical MOSFET device according to the present disclosure.
Figure 2:
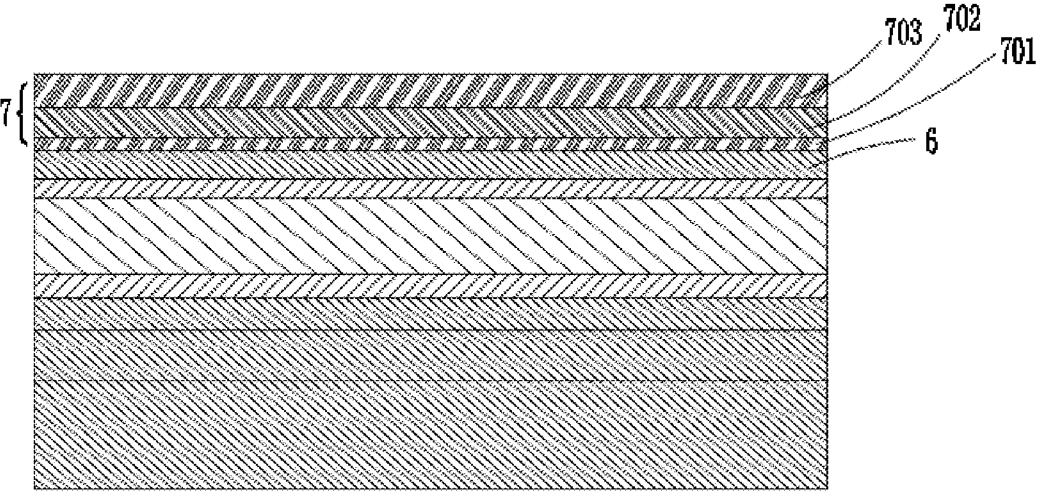

First, in step S1, a first silicon layer 2, a first germanium-silicon layer 3, a second germanium-silicon layer 4, a third germanium-silicon layer 5, and a second silicon layer 6 vertically stacked from bottom to top are formed on a substrate 1 to obtain the structure shown in FIG. 1.

A molar content of germanium in the first germanium-silicon layer 3 and a molar content of germanium in the third germanium-silicon layer 5 are both greater than a content of germanium in the second germanium-silicon layer 4, and selective etching of the three germanium-silicon layers can be realized through the difference contents of germanium. In addition, since the first germanium-silicon layer 3 and the third germanium-silicon layer 5 need to be etched synchronously in the subsequent process, it is preferable that the first germanium-silicon layer 3 and the third germanium-silicon layer 5 are made of material with the same content of germanium. For example, the molar content of germanium in the first germanium-silicon layer 3 and the molar content of germanium in the third germanium-silicon layer 5 are preferably not less than 15% (for example, 15%, 20%, 25%, 30%, 35%, 40%, 45%, 50%, 55%, etc.; more preferably, 15% to 30%), and correspondingly, the molar content of germanium in the second germanium-silicon layer 4 is preferably not more than 15% (for example, 1%, 3%, 5%, 7%, 10%, 13%, 15%, etc.; more preferably, 5% to 15%).

The above-mentioned substrate 1 may be any substrate known to those skilled in the art for carrying components of a semiconductor integrated circuit, such as silicon-on-insulator (SOI), bulk silicon, silicon carbide, germanium, germanium-silicon, gallium arsenide, or germanium-on-insulator, etc., and the corresponding top semiconductor material is silicon, germanium, germanium-silicon or gallium arsenide, etc. At the same time, the doping type of the semiconductor layer on the substrate is determined according to the device type to form a p-well (for nMOSFET) or an n-well (for pMOSFET), as shown in FIG. 1, in which a doped region is shown by a dashed-line box (a boundary between a doped region 1*a* and a non-doped region is marked in the substrate shown in each of the cross-sectional views of FIGS. 1 to 25).

The first silicon layer 2 and the second silicon layer 6 may be used as the source/drain of the transistor through subsequent etching and doping, or may be doped in-situ when the first silicon layer 2 and the second silicon layer 6 are epitaxially grown, so as to form a highly doped n-type or p-type conductive layer (the doping concentration is $1\times10^{19}$ $cm^{-3}$ to $1\times10^{21}$ $cm^{-3}$). Therefore, parameters such as thickness, doping concentration and doping type are determined according to product design.

The first germanium-silicon layer 3 and the second germanium-silicon layer 5 are formed by epitaxial growth. The first germanium-silicon layer 3 and the second germanium-silicon layer 5 may be undoped, or they may be doped in-situ during epitaxial growth. The doping concentration is $1\times10^{18}$ $cm^{-3}$ to $1\times10^{20}$ $cm^{-3}$. The doping concentrations of the first germanium-silicon layer 3 and the second germanium-silicon layer 5 should be lower than the doping concentration of the first silicon layer 2 and the second silicon layer 6, so as to suppress a hot carrier injection effect.

The second germanium-silicon layer 4 will serve as a channel after subsequent etching, so a thickness of the second germanium-silicon layer 4 is preferably greater than a thickness of the first germanium-silicon layer 3 and a thickness of the third germanium-silicon layer 5. For example, in some typical electronic devices, the thicknesses of the first germanium-silicon layer 3 and the third germanium-silicon layer 5 are each 5 nm to 15 nm independently, and the thickness of the second germanium-silicon layer 4 is 15 nm to 100 nm.

According to the material types of the above three germanium-silicon layers and two silicon layers, an appropriate formation process is selected, which usually includes but is not limited to epitaxial growth methods such as reduced pressure chemical vapor deposition (RPCVD), metal organic compound chemical vapor deposition (MOCVD), etc.

Next, in step S2, the first silicon layer 2, the first germanium-silicon layer 3, the second germanium-silicon layer 4, the third germanium-silicon layer 5 and the second silicon layer 6 are etched to form a nano stack structure.

Since the second silicon layer 6 is to be used as the source/drain of the transistor, the second silicon layer 6 needs to be fully protected during etching; at the same time, the regularization of the pattern needs to be ensured. Therefore, the etching needs to be performed with the help of a mask, that is, a mask is deposited on the second silicon layer 6 in advance before etching. For example, the following method is provided.

In step S201, a mask stack 7 is deposited on the second silicon layer 6; the mask stack 7 preferably adopts a hard mask (HM), such as TiN, SiN, $SiO_2$, amorphous silicon, polysilicon, etc.; preferably, a multi-layer stack is adopted, which can adapt to the different selectivities of etching in different processes, and also includes an etching stop layer, etc., so as to play a better protective role, such as the common silicon nitride-silicon-silicon nitride or silicon oxide-silicon-silicon oxide stack. In the present disclosure, it is preferable to use a mask formed by a silicon oxide layer 701, an amorphous silicon layer 702 (or replaced with another dummy mask layer; the amorphous silicon is used as an example below for introduction) and a silicon oxide layer 703 stacked from bottom to top (as exemplified in FIG. 2).

Figure 3:
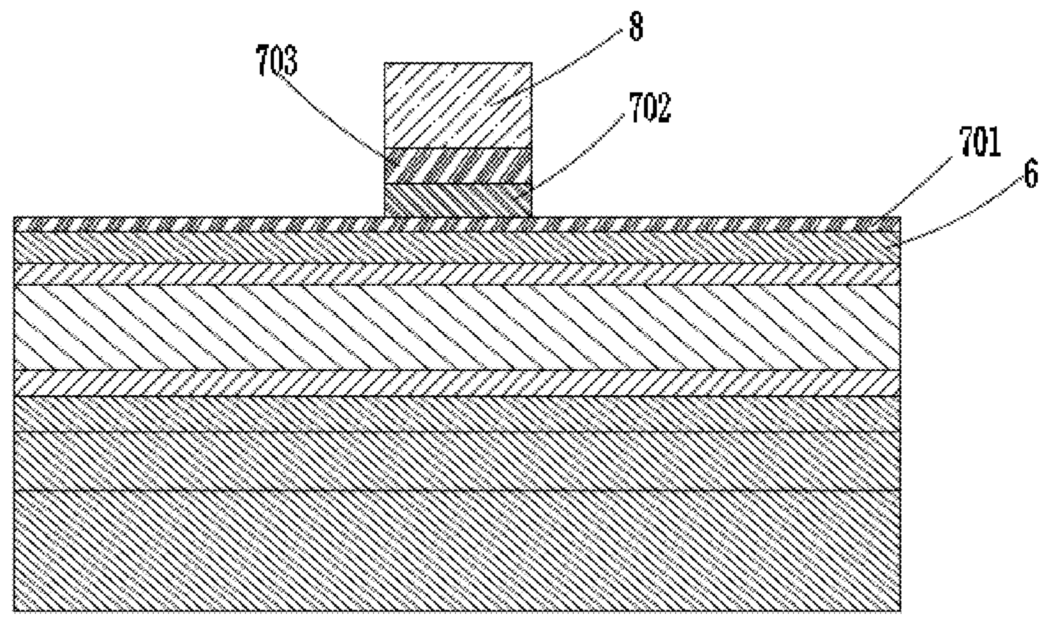

In step S202, the mask stack 7 is patterned: first, the top silicon oxide layer 703 and the amorphous silicon layer 702 in the mask stack are etched by combining photolithography and etching processes to form a pattern mandrel, so as to obtain the structure shown in FIG. 3; then, a photoresist 8 is removed.

In step S203, the silicon oxide layer 701 is etched.

Figure 4:
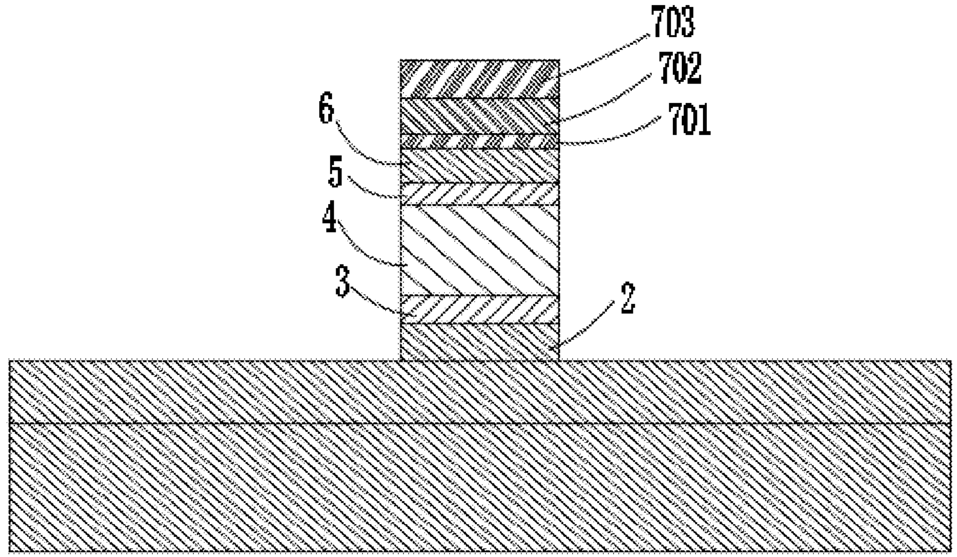
Figure 5:
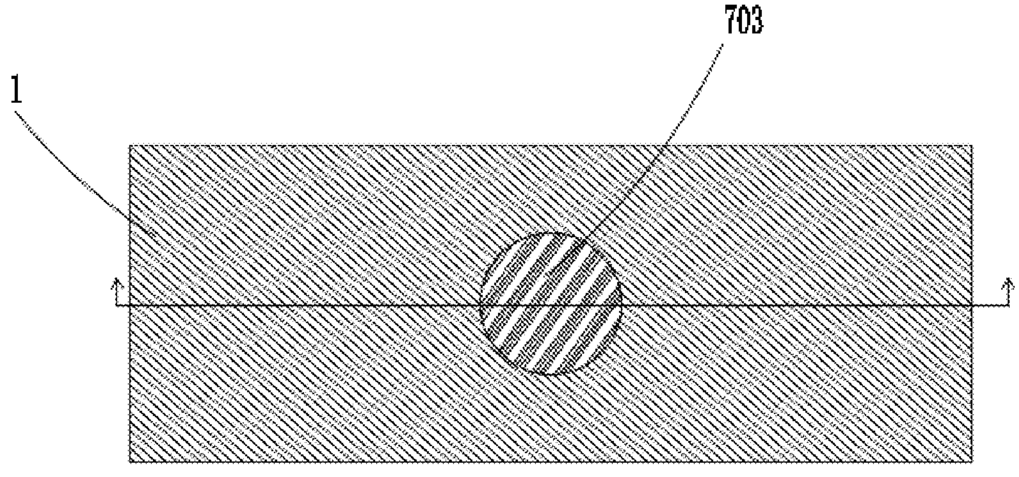
Figure 6:
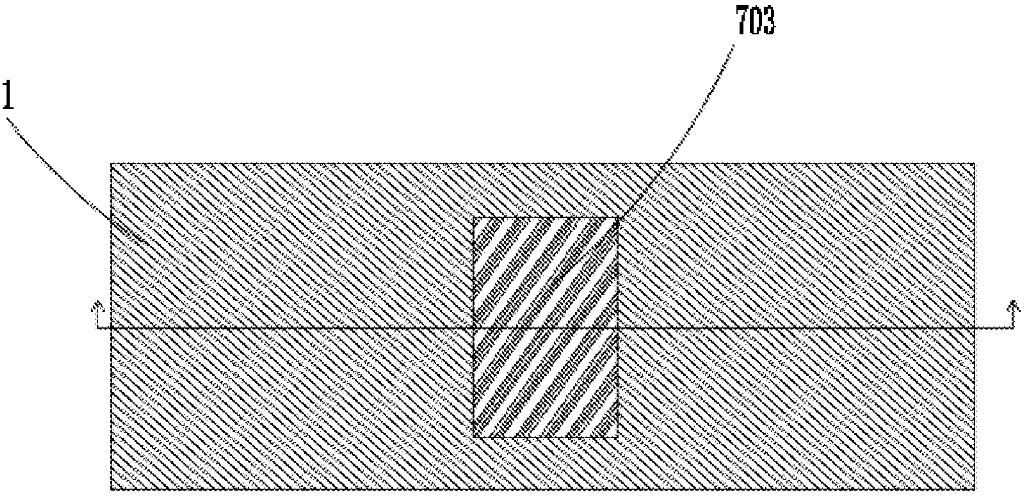

In step S204, the second silicon layer 6, the third germanium-silicon layer 5, the second germanium-silicon layer 4, the first germanium-silicon layer 3 and the first silicon layer 2 are etched to form a nano stack structure as shown in FIG. 4; according to nanowires or nanosheets, the shape of the nano stack structure is determined. For example, FIGS. 5 and 6 show the top-view structures of the nanowires and nanosheets, respectively (arrows in FIGS. 5 and 6 indicate the cross-sectional direction of FIG. 4). All the steps below are described by taking nanowires as an example (but it does not limit the scope of application of the present disclosure).

The etching in the above step S2 may be a dry method (reactive ion etching RIE, plasma etching, high-pressure plasma etching, high-density plasma etching), and wet method (in which an appropriate solvent or solution is selected), etc., or a polishing (CMP) step may also be combined before the etching, and the preferred etching means is usually selected according to the type of material, which is not particularly limited in the present disclosure.

Figure 7:
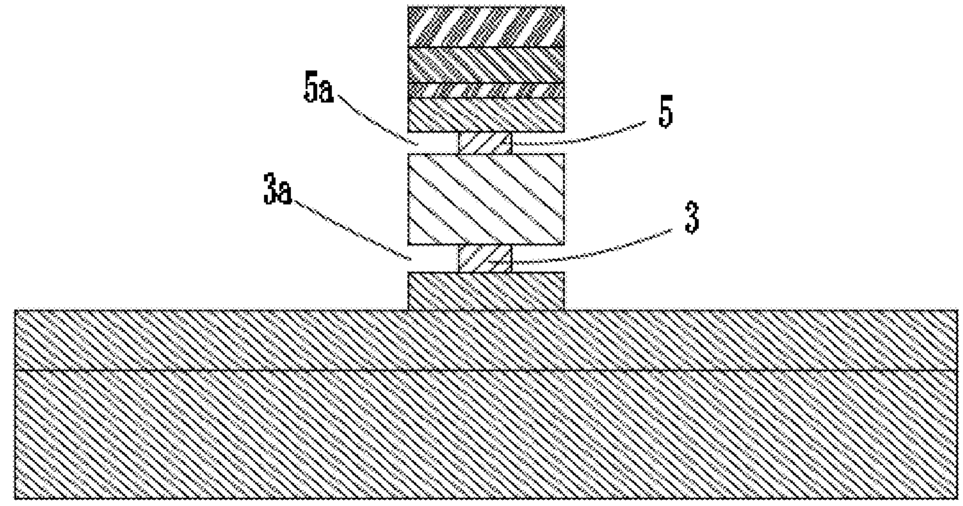

Next, step S3 is performed to selectively etch the first germanium-silicon layer 3 and the third germanium-silicon layer 5 in the nano stack structure, so as to form a first groove 3*a* at sidewalls of the first germanium-silicon layer 3 and a third groove 5*a* at sidewalls of the third germanium-silicon layer 5, so as to obtain the structure shown in FIG. 7.

In step S3, the methods of etching the first germanium-silicon layer 3 and the third germanium-silicon layer 5 include, but are not limited to, dry continuous etching, dry atomic layer etching (ALE), wet continuous etching, wet ALE, etc. The etching amount can be controlled by adjusting various etching parameters, including the magnitude of germanium difference in the three germanium-silicon layers, the amount of etchant, etching power, etching gas flow, etching chamber pressure and etching duration, etc. The etching means is preferably ALE. At the same time, in addition to the selectivity to the second germanium-silicon layer, the selectivities of the etching means and conditions to the first silicon layer and the second silicon layer should also be considered. Since the etching selectivities to the germanium-silicon layers and the silicon layers selected in the present disclosure differ greatly, the sizes of the first groove and the third groove can be better controlled, thereby controlling the size of the inner spacers to be filled subsequently. For a typical MOSFET device, the etching amount in this step is preferably controlled to be 5 nm to 25 nm, that is, the depths of the first groove and the third groove reach 5 nm to 25 nm.

Next, in step S4, inner spacers of an extension region are formed in the first groove and the third groove. The inner spacers of the extension region are preferably made of a material with good dielectric properties and simple deposition process, such as typical silicon oxide.

Since the structural morphology obtained after step S3 has an irregular shape, the formation of the inner spacers of the gate extension region in step S4 needs to go through the processes of depositing and etching back. Specifically, the following steps S401 to S403 are provided.

In step S401: inner spacer material of an extension region 9 (hereinafter, silicon oxide is used as an example) are deposited until all the outer surfaces are covered. The deposition means include but are not limited to methods such as PECVD, LPCVD and ALD, so as to obtain the structure shown in FIG. 8.

In step S402: chemical mechanical polishing or selective etching is performed on the silicon oxide until the dummy mask amorphous silicon layer 702 in the mask stack is exposed. In this step, if the inner spacer material of the extension region is not silicon oxide, it needs to be carried out step by step.

In step S403: anisotropic etching is performed until the inner spacer material of the extension region only fully fills in the first groove and the third groove.

In order to avoid that the etching in step S403 does not cause damage to the second silicon layer, it is preferable to replace the silicon layer in the mask with material with a large difference in the etching selectivity from the inner spacer material of the extension region. The "large difference" herein refers to etching selectivity compared with the inner spacer material of the extension region and silicon. Taking silicon oxide being used as the inner spacer material of the extension region as an example, it is preferable to replace the silicon in the mask with silicon nitride. To achieve the above purpose, the following steps S402*a* to S402*c* may be added between step S402 and step S403 (for the convenience of description, the inner spacer of the silicon oxide extension region is taken as an example herein).

Figure 8:
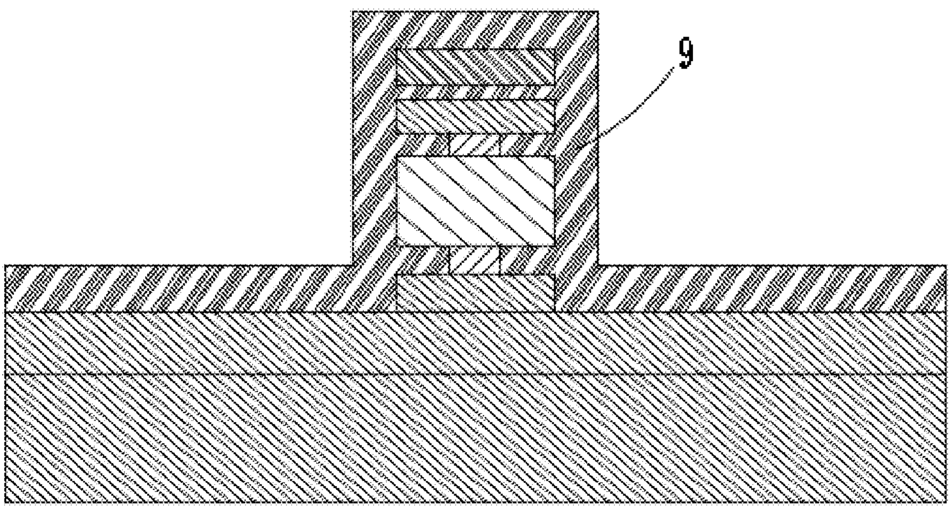
Figure 9:
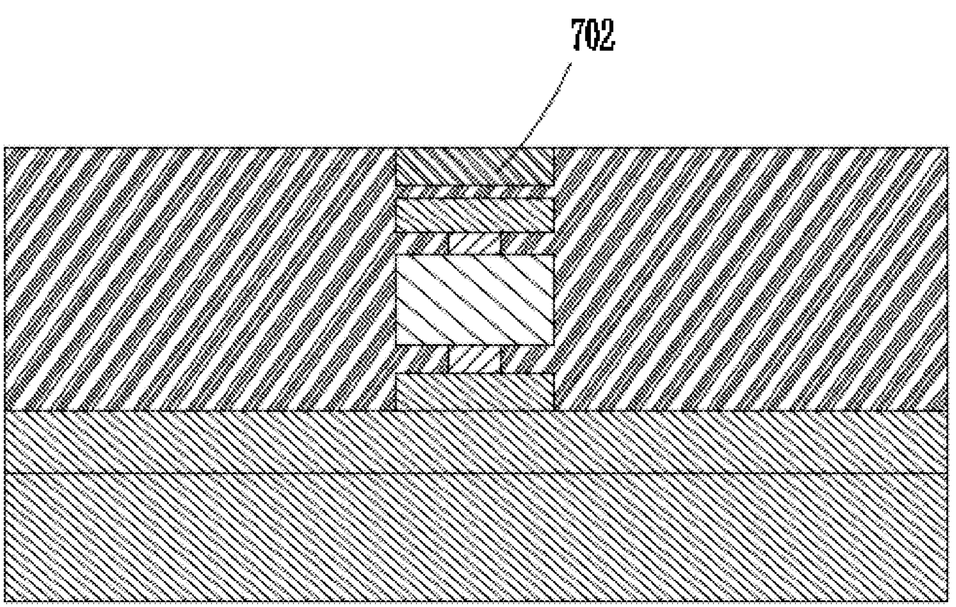
Figure 10:
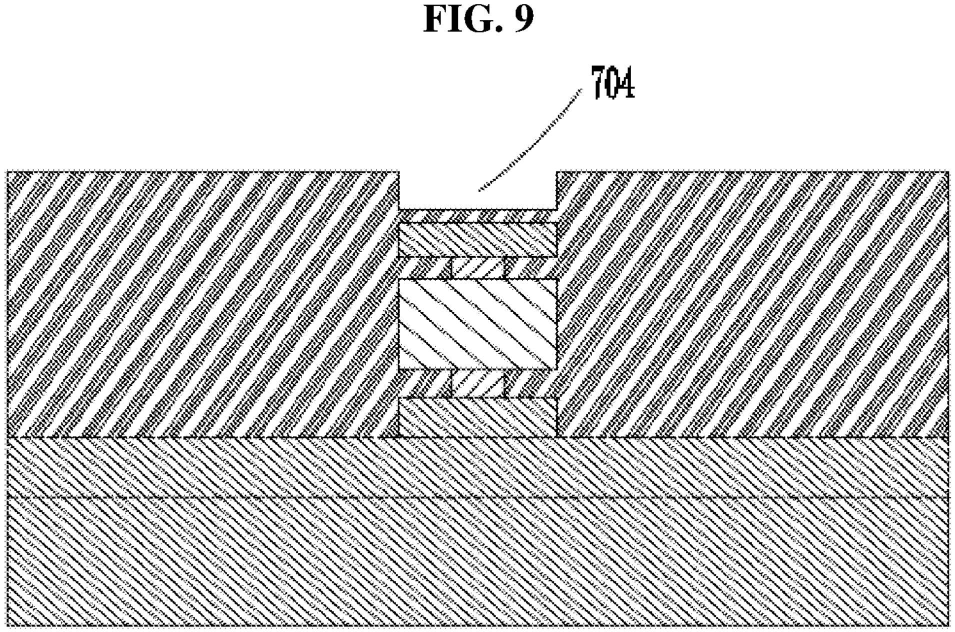

In step S402*a*: the inner spacer material of the extension region such as silicon oxide is filled in a large area on the basis of FIG. 8.

In step S402*b*: the silicon layer in the mask is removed to form a mask groove 704. In this step, CMP may be first performed on the inner spacer material of the extension region such as silicon oxide until the dummy mask amorphous silicon layer in the mask is exposed, so as to obtain the structure shown in FIG. 9; then the dummy mask amorphous silicon layer is etched and removed by wet etching method such as TMAH, so as to form a mask groove 704, thus obtaining the structure shown in FIG. 10.

Figure 11:
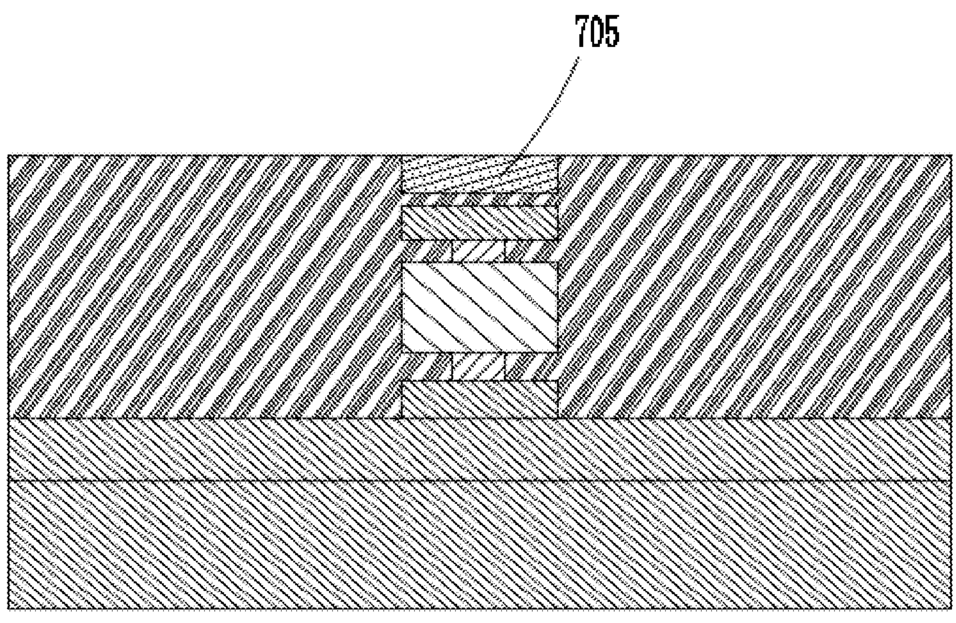

In step S402*c*: the mask groove 704 is filled with material with a large difference in the etching selectivity from the inner spacer material of the extension region, such as silicon nitride, so as to obtain the structure shown in FIG. 11. Similarly, when depositing silicon nitride in this step, it is also necessary to remove the silicon nitride outside the mask groove by CMP after the large-area deposition, so that only the mask groove is fully filled with silicon nitride, i.e., a replacement mask 705.

Figure 12:
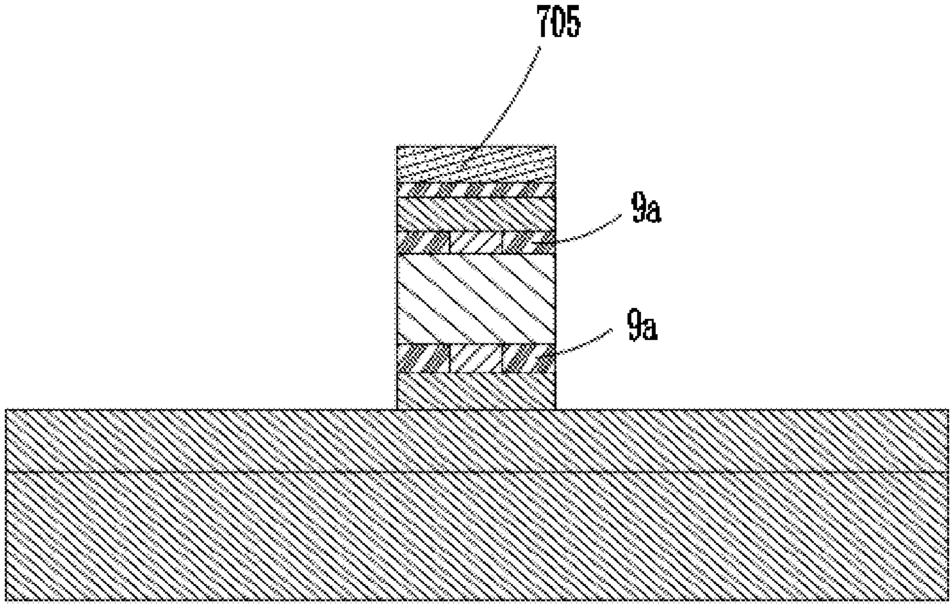
Figure 13:
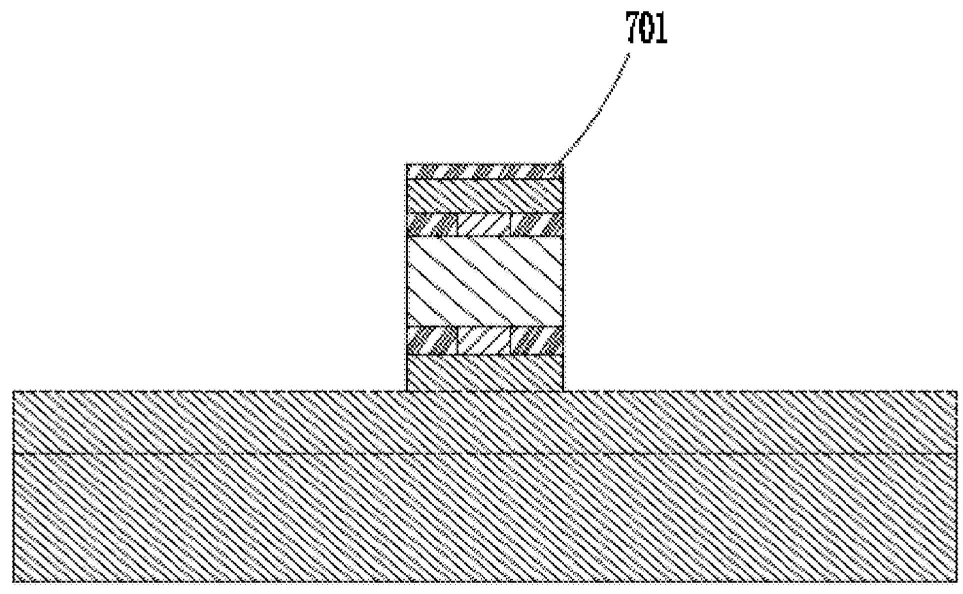

Then, step S403 is performed to form the morphology shown in FIG. 12 by anisotropic etching, thus obtaining the inner spacers 9*a* of the extension region. In addition, the replacement mask 705 may also be removed after the completion of step S403, thus obtaining the structure shown in FIG. 13, and the top silicon oxide etching stop layer 701 is still left. In the actual process, the replacement mask 705 may be removed in a subsequent process, which is not particularly limited in the present disclosure.

Figure 14:
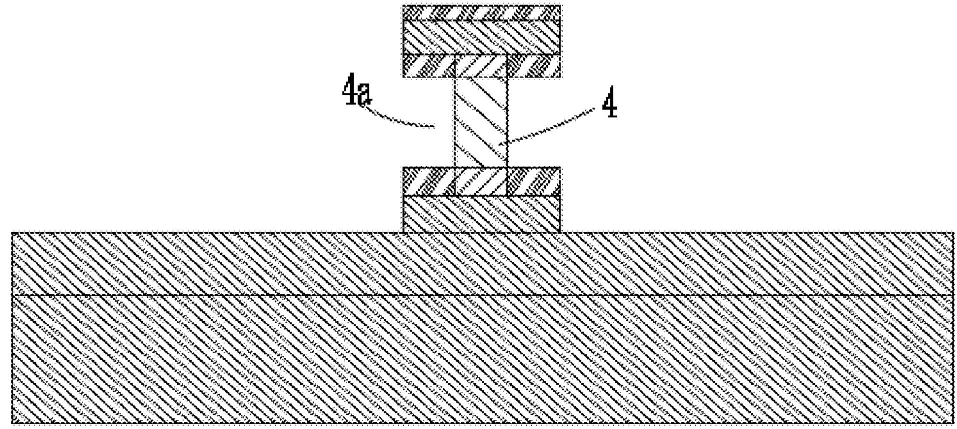

Next, in step S5, the second germanium-silicon layer 4 is selectively etched, so that a gate groove 4*a* is formed at the sidewall of the second germanium-silicon layer 4, thus obtaining the structure shown in FIG. 14.

Etching in this step preferably adopts atomic layer etching (ALE). Since this layer uses germanium-silicon material in the present disclosure, which has an etching selectivity greatly different from that of silicon, the size of the channel and the sizes of the subsequent gates on both sides can also be better controlled, thereby improving the device yield. The amount of etching in this step depends on the size of the channel.

Next, in step S6, a dummy gate is formed in the gate groove. The purpose of forming the dummy gate in advance is to form a source/drain by doping on one hand, and to form shallow trench isolation on the other hand. Since the protection and conformality of the inner spacers of the extension region should be considered, comprehensive consideration should be taken when selecting the dummy material. Nitrides, such as common silicon nitride, are preferably used in the present disclosure. Also, this step needs to be completed step by step due to the shape limitation to the dummy gate, such as by using the following method.

Figure 15:
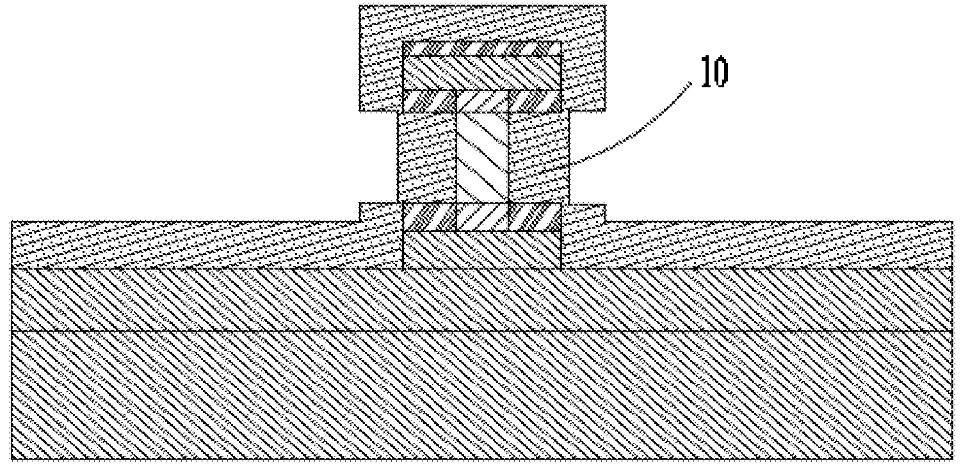

In step S601: dummy gate material 10 is deposited until all the outer surfaces are covered, preferably by using an isotropic deposition method, so as to obtain the structure shown in FIG. 15.

Figure 16:
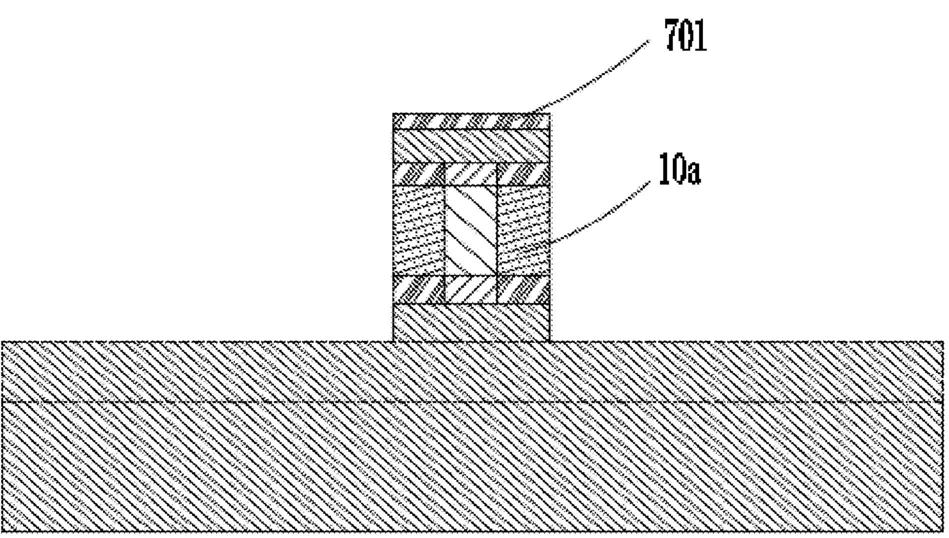

In step S602: the dummy gate material 10 is etched until only the gate groove is filled with the dummy gate material 10 to form a dummy gate 10*a*, preferably by using anisotropic etching, so as to obtain the structure shown in FIG. 16.

Figure 17:
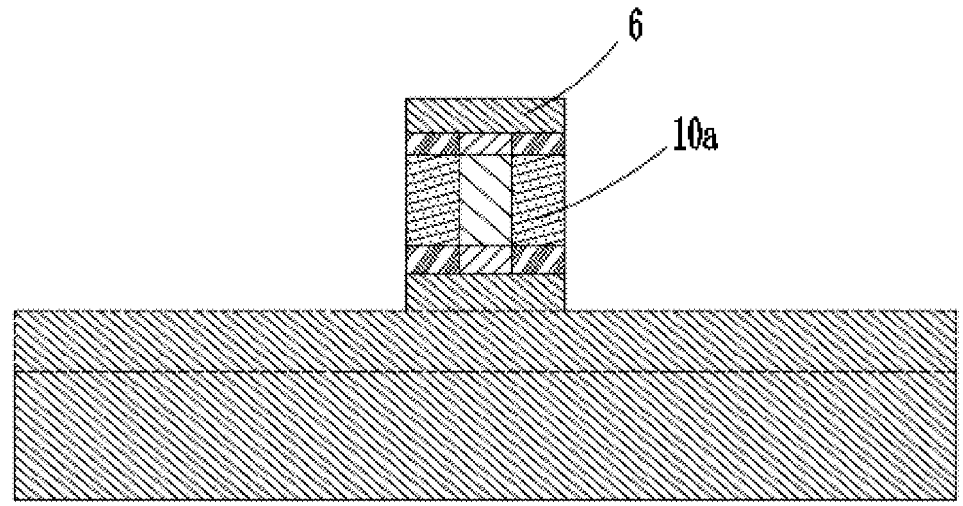

In step S603: the mask is removed; if the replacement mask has been removed before, then it is only required to take out the silicon oxide layer 701 (the etching stop layer) in this step, so as to obtain the structure shown in FIG. 17.

Figure 18:
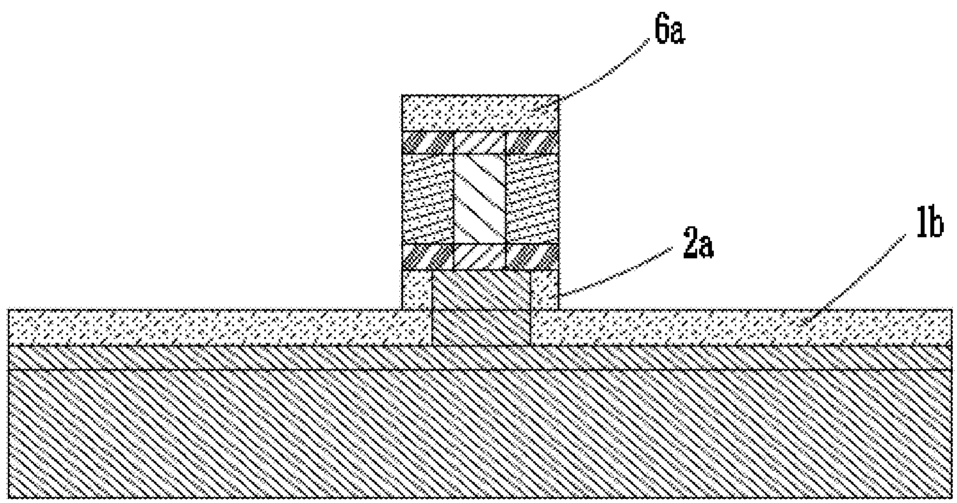

Next, in step S7, the first silicon layer 2 and the second silicon layer 6 are respectively doped to form a source/drain 2*a*, 6*a*. Elements such as boron, phosphorus or arsenic are injected, and the type depends on the device type. When the first silicon layer 2 is doped, the superficial layer of the substrate is doped, and it is possible that only edge regions 1*b* on both sides of the first silicon layer are doped, as shown in FIG. 18. In practical applications, the doping method, the injection angle and the like are controlled according to device requirements.

Next, in step S8, after the dummy gate is formed, the substrate is etched and dielectric material is deposited to form an active region with a shallow trench isolation layer.

When the active region is formed, it is necessary to preserve the conformality of the inner spacers of the extension region, so as to ensure the etching selectivities of the isolation material and each layer in the nano stack structure at the same time. Therefore, it is necessary to form a protective layer on the sidewall of the nano stack structure before forming the active region. Specifically, the following steps are provided.

Figure 19:
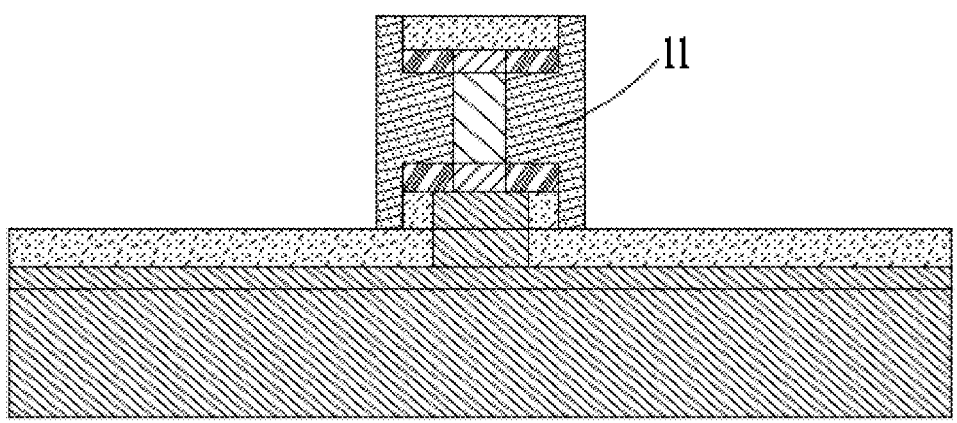

In step S801: a spacer protective layer 11 is formed on the sidewall of the nano stack structure to obtain the structure shown in FIG. 19. The protective layer may be made of dielectric material such as silicon nitride. On one hand, it protects the stack structure (especially the inner spacer), and on the other hand, a bottom end thereof may be reserved as an isolation layer for the source/drain to reduce leakage current and parasitic capacitance. A thickness of the protective layer 11 may be selected from 5 nm to 10 nm. Using a common deposition process, the protective layer is also formed in two steps: large-area deposition first, and then anisotropic etching.

In step S802: the substrate is etched to form an active region.

In step S803: dielectric material such as silicon oxide is deposited until all the outer surfaces are covered.

Figure 20:
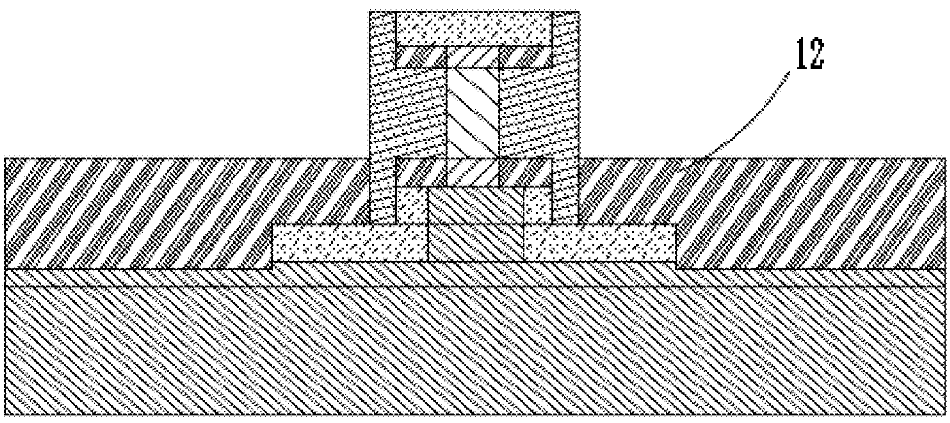

In step S804: the dielectric material is etched back until the surface height of the dielectric material is flush with the upper surface height of the first germanium-silicon layer to form a shallow trench isolation layer 12, so as to obtain the structure shown in FIG. 20.

Figure 21:
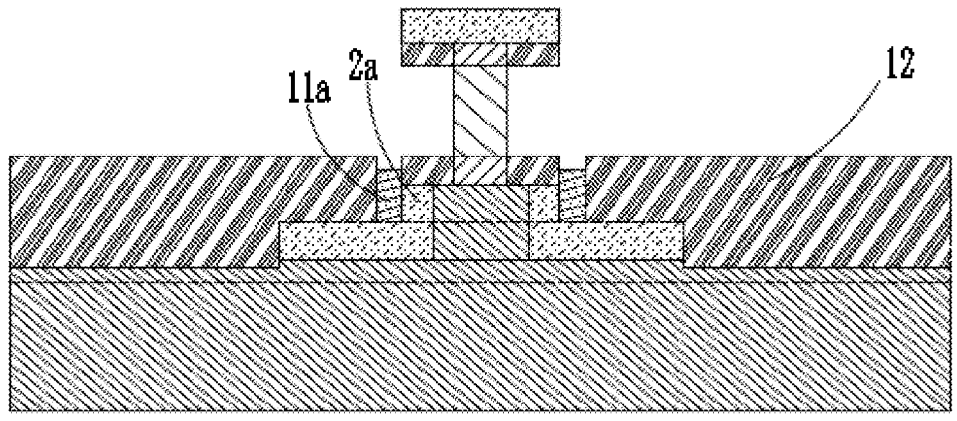

Next, in step S9, the dummy gate 10*a* in the active region is removed to obtain the structure shown in FIG. 21.

If the protective layer in step S801 exists, the protective layer needs to be removed first. In order to simplify the process, the protective layer is preferably made of the same material as the dummy gate, such as silicon nitride, so that the protective layer and the dummy gate 10*a* may be removed synchronously by isotropic etching using thermal $H_3PO_4$ solution or RIE. During the removal process, it is necessary to control the amount of etching and etching conditions, etc., so as to ensure that part of the spacer protective layer material 11*a* remains between the shallow trench isolation layer (STI) and the first silicon layer (the source/drain has been formed by the previous process) (see the structure shown in FIG. 21). This remaining part can separate the STI and the source/drain, so as to reduce the leakage problem and reduce the parasitic capacitance.

Figure 22:
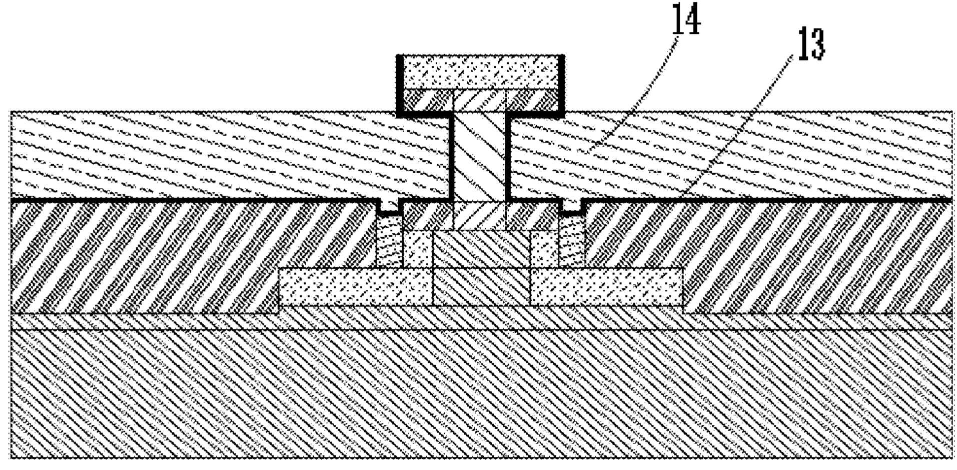

Next, in step S10, a replacement gate stack layer is formed, which includes a gate dielectric layer 13 and a gate 14, so as to obtain the structure shown in FIG. 22.

In this step, high-k dielectric material may be used for the gate dielectric layer, which includes but is not limited to $HfO_2$, $HfSiO_x$, $HfAlO_x$, $HfZrO_x$, etc. A thinner oxide layer (0.3 nm to 1.5 nm) may also be deposited as a barrier layer before depositing the gate dielectric. The gate material is deposited outside the gate layer, and the gate material includes but is not limited to titanium, tungsten, titanium nitride, etc., which may be a single-layer or multi-layer stack. When the gate dielectric and the gate are deposited, both of them are deposited in a large area, so it is necessary to etch back and/or polish a preset thickness and height. The height of the gate is preferably lower than the height of the upper source/drain, more preferably lower than the height of the upper inner spacer, so as to reduce the parasitic capacitance.

Figure 23:
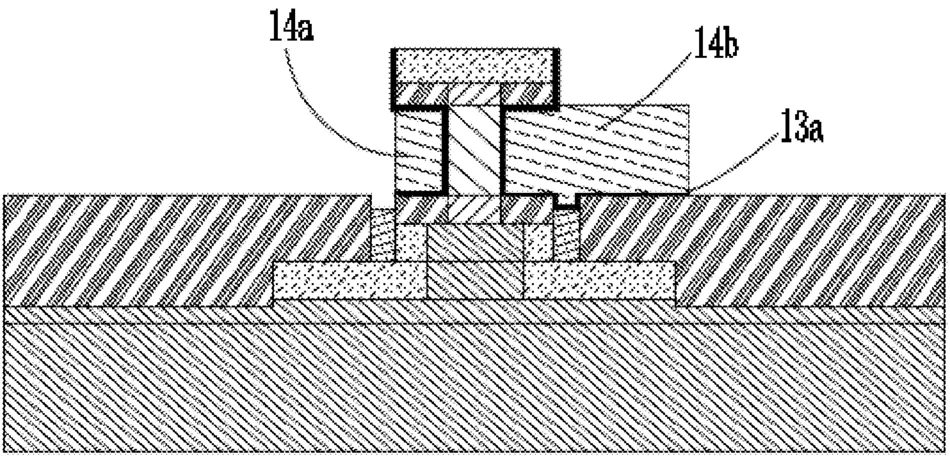

Next, in step S11, the gate 14 is patterned with the help of photoresist to form patterned gate 14*a* and gate dielectric 13*a*, a landing pad 14*b* for leading out contact holes is left, and the photoresist is removed, so as to obtain the structure shown in FIG. 23.

Figure 24:
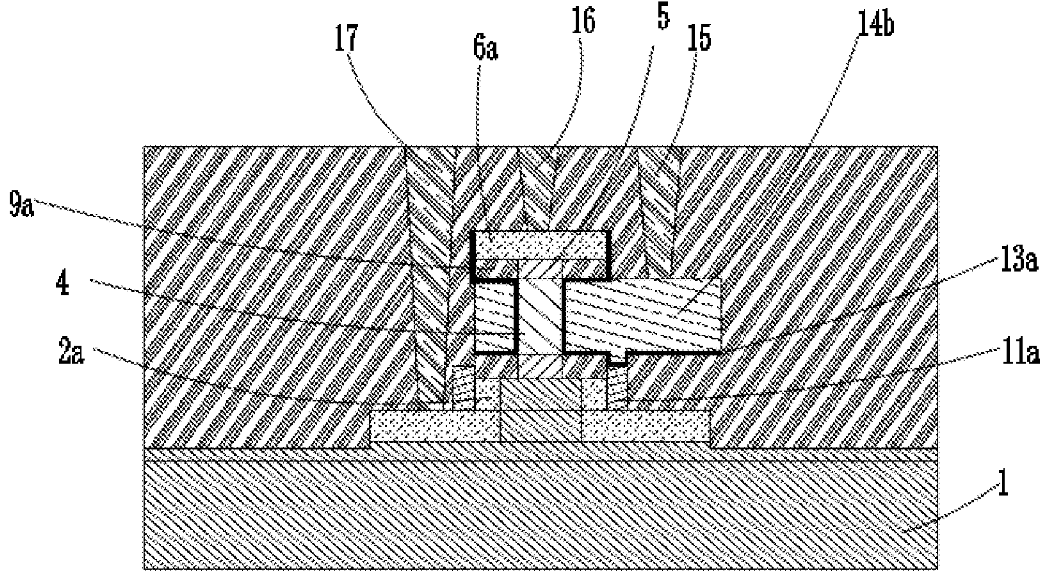
Figure 25:
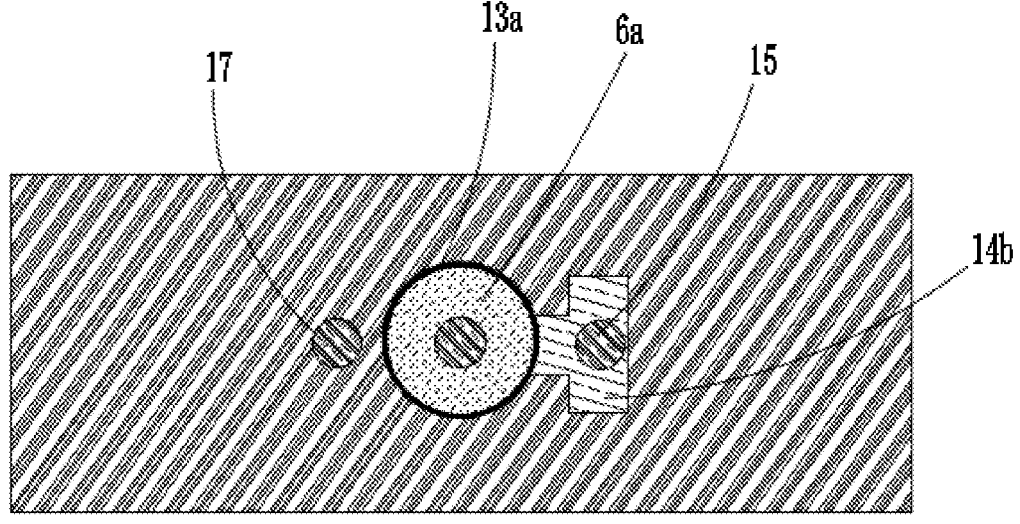

Finally, silicon oxide is deposited in a large area, and source/drain contact holes and gate contact holes (including source/drain contact holes 16, 17, and gate contact hole 15) are respectively introduced to realize metal interconnection, etc., so as to obtain the structure shown in FIG. 24. FIG. 25 is the top-view morphology of FIG. 24.

The vertical MOSFET device manufactured according to the above method of the present disclosure has roughly the following structure.

Figure 26:
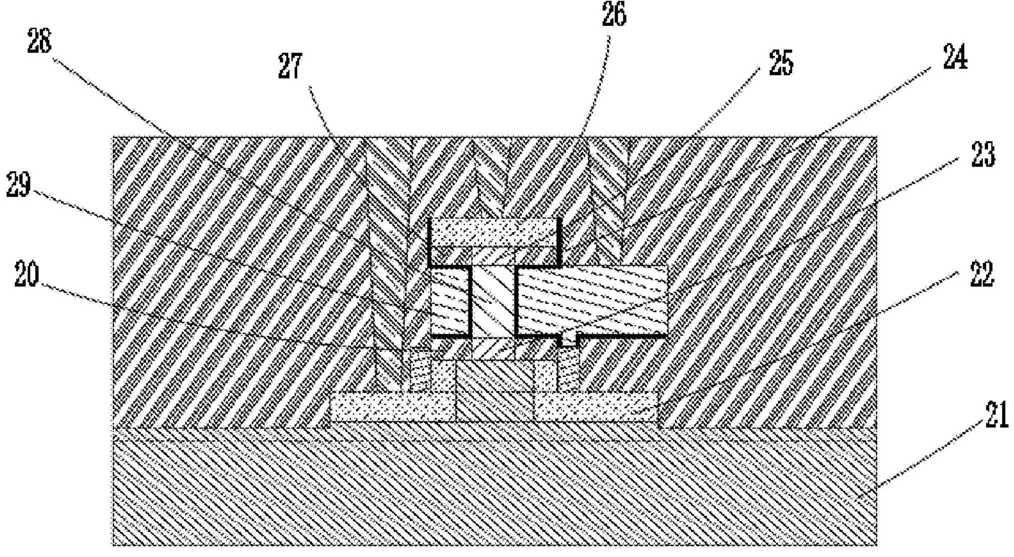
FIG. 26 is a schematic cross-sectional structural view of a vertical MOSFET device according to the present disclosure.

As shown in FIG. 26, the vertical MOSFET device includes a substrate 21, as well as a source/drain 22, a first extension region 23, a channel 28, a second extension region 25, and a source/drain 26 stacked from bottom to top on the substrate 21; gates are located on both sides of the channel 28, and the gates and the channel 28 are isolated by gate dielectric; first inner spacers 20 are located on both sides of the first extension region 23, second inner spacers 27 are located on both sides of the second extension region 25, and the gates 29 are located between the first inner spacers 10 and the second inner spacers 27.

The first extension region 23, the channel and the second extension region 25 are all made of germanium-silicon material, and a molar content of germanium in the first extension region 23 and a molar content of germanium in the second extension region 25 are both greater than the content of germanium in the channel; and the sources/drains 22, 26 are doped silicon.

The first extension region 23 and the second extension region 25 are the remaining parts after etching the first germanium-silicon layer and the third germanium-silicon layer by the above method, which are sandwiched by the inner spacers, and these two extension regions may be used as the extension of the channel.

In the MOSFET device prepared by the above process, the sidewalls of the sources/drains, the sidewalls of the first inner spacers 20 and the sidewalls of the second inner spacers 27 are connected with each other to form a groove, and the gates 29 are located in the groove. The width of the first inner spacers of the first extension region 23 in a direction parallel to the nanowire channel is preferably 5 nm to 15 nm, and the depth of the groove in a direction perpendicular to the nanowire channel is preferably 5 nm to 25 nm.

At the same time, the material of various layers in the MOSFET device are as described in the above process, and various types suitable for them may be selected.

Although the present disclosure provides a MOSFET device with the above structure, it does not mean that the vertical MOSFET device provided by the present disclosure can only be manufactured by the above process, and it can also be obtained by other feasible methods.

Embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

The invention claimed is:

1. A vertical MOSFET device, comprising a substrate, a source/drain, a first extension region, a channel, a second extension region, and a source/drain stacked from bottom to top on the substrate;

wherein gates are located on both sides of the channel, and the gates and the channel are isolated by gate dielectric; first inner spacers are located on both sides of the first extension region, second inner spacers are located on both sides of the second extension region, and the gates are located between the first inner spacers and the second inner spacers;

wherein the first extension region, the channel and the second extension region are all made of germanium-silicon material, and a molar content of germanium in the first extension region and a molar content of germanium in the second extension region are both greater than a content of germanium in the channel; and the sources/drains are silicon doped with ions; and wherein the first extension region has the same thickness as the first inner spacers, the second extension region has the same thickness as the second inner spacers, the top and bottom surface of the first extension is the same as the top and bottom surface of the first inner spacer, the top and bottom surface of the second extension is the same as the top and bottom surface of the second inner spacer; and the outer sidewalls of the first inner spacers and the second inner spacers are substantially flush with the outer sidewalls of the source/drain.

2. The vertical MOSFET device according to claim 1, wherein the first inner spacers and the second inner spacers are made of silicon oxide.

3. The vertical MOSFET device according to claim 1, wherein the molar content of germanium in the first extension region and the molar content of germanium in the second extension region are the same, which is not less than 15%.

4. The vertical MOSFET device according to claim 1, wherein the molar content of germanium in the first extension region and the molar content of germanium in the second extension region are respectively 15% to 30%, and/or the molar content of germanium in the channel is 5% to 15%.

5. The vertical MOSFET device according to claim 1, wherein sidewalls of the sources/drains, sidewalls of the first inner spacers and sidewalls of the second inner spacers are connected with each other to form a groove, and the gates are located in the groove.

6. The vertical MOSFET device according to claim 5, wherein a width of the first inner spacers of the first extension region in a direction parallel to the channel is 5 nm to 15 nm, and/or a depth of the groove in a direction perpendicular to the channel is 5 nm to 25 nm.

* * * * *